(12) United States Patent
Hairston

(10) Patent No.: US 10,623,670 B1
(45) Date of Patent: Apr. 14, 2020

(54) SIMULTANEOUS MULTIPLE WELL SIZE INTEGRATION

(71) Applicant: BAE Systems Information and Electronic Systems Integration Inc., Nashua, NH (US)

(72) Inventor: Allen W. Hairston, Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/749,610

(22) PCT Filed: Jul. 18, 2017

(86) PCT No.: PCT/US2017/042588
§ 371 (c)(1),
(2) Date: Feb. 1, 2018

(87) PCT Pub. No.: WO2019/017908
PCT Pub. Date: Jan. 24, 2019

(51) Int. Cl.
*H04N 5/355* (2011.01)
*H04N 5/378* (2011.01)

(52) U.S. Cl.
CPC ........... *H04N 5/3559* (2013.01); *H04N 5/378* (2013.01)

(58) Field of Classification Search
CPC .............................. H04N 5/3559; H04N 5/378
See application file for complete search history.

(56) References Cited

U.S. PATENT DOCUMENTS

| 5,886,353 | A |  | 3/1999 | Spivey et al. |
| 2004/0041077 | A1 |  | 3/2004 | Fossum |
| 2008/0174464 | A1 | * | 7/2008 | Robert ................... H03M 1/162 341/155 |
| 2012/0268727 | A1 | * | 10/2012 | Schrey .................... G01S 17/89 356/5.01 |
| 2015/0281612 | A1 |  | 10/2015 | Lund et al. |
| 2016/0198101 | A1 | * | 7/2016 | Bagwell ................... H04N 5/33 348/164 |

OTHER PUBLICATIONS

International Search Report, PCT/US17/42588, dated Oct. 2, 2017, 16 pages.

* cited by examiner

*Primary Examiner* — Lin Ye
*Assistant Examiner* — John H Morehead, III
(74) *Attorney, Agent, or Firm* — Scott J. Asmus; Maine Cernota & Rardin

(57) ABSTRACT

An integration circuit having multiple wells that allow for the simultaneous storage of charge during an integration interval and techniques for using the same provide benefits in dynamic range that enhance the performance of pixels. The circuit and techniques described herein could also be used in many different infrared focal plane array applications where higher dynamic range is desired and multiple gain state outputs are allowed.

20 Claims, 5 Drawing Sheets

SIMULTANEOUS MULTIPLE WELL SIZE INTEGRATION

FIELD

The present disclosure relates to pixel design, and more particularly, to integration circuits used therein.

BACKGROUND

Charge coupled devices (CCDs), complementary metal oxide semiconductor (CMOS) devices, and infrared imagers, which may be referred to generally as Solid State Area Array Imaging Devices (SSAAIDs), are used to capture images received in the form of light. They are currently widely used for both defense and commercial purposes. Some popular uses include digital cameras, scanners, cell phones, and surveillance devices.

SSAAIDs contain pixels arranged in a grid, which is referred to as a Focal Plane Array (FPA). Each pixel of an SSAAID generates and holds an amount of charge proportionate to the intensity of light incident thereon and the length of time that light was allowed to fall on the pixel using an integration circuit.

An integration circuit performs the mathematical operation of integration with respect to time. Said another way, the output voltage of an integration circuit is proportional to the input voltage, integrated over time (Output∝∫Input). In the case of a pixel, the input voltage is generated by the impact of photons on a detector. The charge handling capacity of such a circuit is determined by voltage, integration time, and capacitance of its capacitor(s).

Current SSAAIDs are limited in their ability to provide acceptable images in moderate to low light level conditions as well as in high light level conditions by the dynamic range of the integration circuit of the pixels. In low light level conditions, where there are relatively few incoming photons incident on any given pixel, the signal-to-noise ratio (SNR) of the output is very low, resulting in a grainy/noisy image in dark areas of the image. Moreover, in low SNR situations, other variables can also create non-uniformities in the images where the signal levels are not sufficient to overcome the sensitivity anomalies.

Pixel integration circuits may also become saturated in high light level conditions. When a large amount of light hits a pixel, the integration circuit of that pixel, and even those of nearby pixels due to a phenomenon referred to as "blooming", become saturated, a situation that results in the integration circuit ceasing to be able to capture additional information. Saturation results in washed out images or portions thereof. Although anti-blooming circuits may be used to help reduce the impact of one or a cluster of saturated pixels on others, to increase high light level performance of a given pixel requires increasing the capacity, or well size, of its integration circuit, thereby preventing saturation over a given interval of time.

Prior art FPAs have used shorter integration times to provide better low gain, or high light, performance, but are less sensitive as a result and therefore less able to capture low light level conditions.

Said simply, existing integration circuits used in pixels have limited dynamic range, resulting in a loss of details in high and low light level areas of an image, and are more complex than necessary. What is needed, therefore, is an integration circuit that is simpler while offering more dynamic range, without loss of sensitivity, than currently available and a method of operating the same.

SUMMARY

One embodiment of the present disclosure provides an integration circuit, the integration circuit comprising: an input configured to carry an input current; a first well comprising an input, an output, and a first integration capacitor configured to collect the input current, wherein a first well voltage changes proportionally to the input current over an integration time; a second well comprising an input, an output, and a second integration capacitor configured to collect the input current, wherein a second well voltage changes proportionally to the input current over an integration time and wherein the second well input begins to collect a charge from the input current when the first well voltage approaches a predetermined level; a reset switch electrically connected between the input and output of the second well; a gain control transistor electrically connected between the output of the second well and the output of the first well and configured to allow charge to be integrated on the second well when the first well is full; a first sampling switch electrically connected to the first well; a first voltage-measuring device electrically connected to the first sampling switch, such that charge flows through the first sampling switch into the first voltage-measuring device upon closure of the first sampling switch; a second sampling switch electrically connected to the first well; and a second voltage-measuring device electrically connected to the second sampling switch, such that charge flows through the second sampling switch into the second voltage-measuring device upon closure of the second sampling switch.

Another embodiment of the present disclosure provides such an integration circuit further comprising an amplifier with capacitive feedback electrically connected between the inputs and outputs of the first and second wells.

A further embodiment of the present disclosure provides such an integration circuit further comprising a bias control transistor having a source, a gate, and a drain, wherein the source is connected to the input, the gate is connected to a bias control voltage and the drain is connected to the output of the first and second integration capacitors.

Yet another embodiment of the present disclosure provides such an integration circuit further comprising an inverting amplifier connected between the source and gate of the bias control transistor.

A yet further embodiment of the present disclosure provides a pixel comprising such an integration circuit.

One embodiment of the present disclosure provides an integration circuit, the integration circuit comprising: an operational amplifier comprising a non-inverting positive input, a non-inverting negative input, and an output; a first well having an input and an output, wherein the first well input is electrically connected to the inverting negative input of the operational amplifier and the first well output is electrically connected to the output of the operational amplifier; a second well having an input and an output, wherein the second well input is electrically connected the non-inverting negative input of the operational amplifier and the second well output is electrically connected to the output of the operational amplifier, wherein the first well and the second well are connected in parallel; a reset switch electrically connected between the input and output of the second well; a gain control switch electrically connected between the output of the second well and the output of the first well; a first sampling switch electrically connected to the output of the operational amplifier; a first charge-measuring device electrically connected to the first sampling switch, such that charge flows through the first sampling switch into the first charge-measuring device upon closure of the first sampling switch; a second sampling switch electrically connected to the output of the operational amplifier; and a second charge-measuring device electrically connected to the second sampling switch, such that charge flows through the second sampling switch into the second charge-measuring device upon closure of the second sampling switch.

Another embodiment of the present disclosure provides such an integration circuit wherein the second well is of a relatively lower gain compared to the first well.

A further embodiment of the present disclosure provides such an integration circuit wherein the gain control switch is a field effect transistor having a source, a drain, and a gate, wherein the source and drain are connected between the outputs of the first and second wells and the gate is electrically connected to a source of voltage proportional to a charge on the first well, wherein the gate is configured to allow charge to flow between the drain and source upon a threshold voltage indicative of the first well nearing saturation, thereby allowing charge to flow to the second well.

Yet another embodiment of the present disclosure provides such an integration circuit wherein the field effect transistor is an n-type field effect transistor.

A yet further embodiment of the present disclosure provides such an integration circuit wherein the drain is electrically connected to the output of the second well, the source is electrically connected to the output of the first well.

Still another embodiment of the present disclosure provides such an integration circuit wherein each well comprises at least one capacitor.

A still further embodiment of the present disclosure provides such an integration circuit further comprising a detector diode electrically connected to the inverting negative input of the operational amplifier.

Even another embodiment of the present disclosure provides a pixel comprising such an integration circuit.

One embodiment of the present disclosure provides a method of operating an integration circuit, the method comprising: on an integration circuit comprising: an operational amplifier comprising a non-inverting positive input, a non-inverting negative input, and an output; a first well having an input and an output, wherein the first well input is electrically connected to the inverting negative input of the operational amplifier and the first well output is electrically connected to the output of the operational amplifier; a second well having an input and an output, wherein the second well input is electrically connected the non-inverting negative input of the operational amplifier and the second well output is electrically connected to the output of the operational amplifier, wherein the first well and the second well are connected in parallel; a reset switch electrically connected between the input and output of the second well; a gain control field effect transistor having a source, a drain, and a gate, wherein the source and drain are connected between the outputs of the first and second wells and the gate is electrically connected to a source of voltage proportional to a charge on the first well, wherein the gate is configured to allow charge to flow between the drain and source upon a threshold voltage indicative of the first well nearing saturation, thereby allowing charge to flow to the second well; a first sampling switch electrically connected to the output of the operational amplifier; a first charge-measuring device electrically connected to the first sampling switch, such that charge flows through the first sampling switch into the first charge-measuring device upon closure of the first sampling switch; a second sampling switch electrically connected to the output of the operational amplifier; and a second charge-measuring device electrically connected to the second sampling switch, such that charge flows through the second sampling switch into the second charge-measuring device upon closure of the second sampling switch; wherein the integration circuit is electrically connected to a source of current to be measured over an integration interval; integrating a current over an integration interval by: applying a voltage in excess of the threshold voltage to the gain control field effect transistor, thereby enabling current to flow between the source and drain thereof; closing the reset switch, thereby resetting the first and second wells; removing the voltage from the gate of the gain control field effect transistor; opening the reset switch, thereby allowing charge to build on the first well; wherein, if the first well approaches saturation charge flows through the gain control field effect transistor, allowing integration to continue on the second well; sampling the first well by disconnecting the threshold voltage from the gate of the gain control field effect transistor, if a threshold voltage was applied during the integration interval, and closing the first sampling switch, thereby allowing charge from the first well to flow into the first charge measuring device; and if a threshold voltage was applied to the gate of the gain control field effect transistor during the integration interval, opening the second sampling switch and applying a threshold voltage to the gate of the gain control field effect transistor, thereby allowing charge to equalize between the first and second wells and to flow into the second charge-measuring device.

Another embodiment of the present disclosure provides such a method of operating an integration circuit wherein the first well is of a relatively higher-gain.

A further embodiment of the present disclosure provides such a method of operating an integration circuit wherein a voltage above the threshold voltage is applied to the gate of the gain control field effect transistor following an integration interval regardless of whether or not the first well was saturated, allowing charge to be fully shared across the first and second wells, prior to sampling, allowing for charge measurement on either the first or second charge measuring device whether or not the first well was saturated during the integration interval.

Yet another embodiment of the present disclosure provides such a method of operating an integration circuit wherein the charge transferred to the first and second charge-measuring devices is read out during a subsequent integration.

A yet further embodiment of the present disclosure provides such a method of operating an integration circuit wherein the charge is read out of the first and second charge-measuring devices by a readout integrated circuit.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
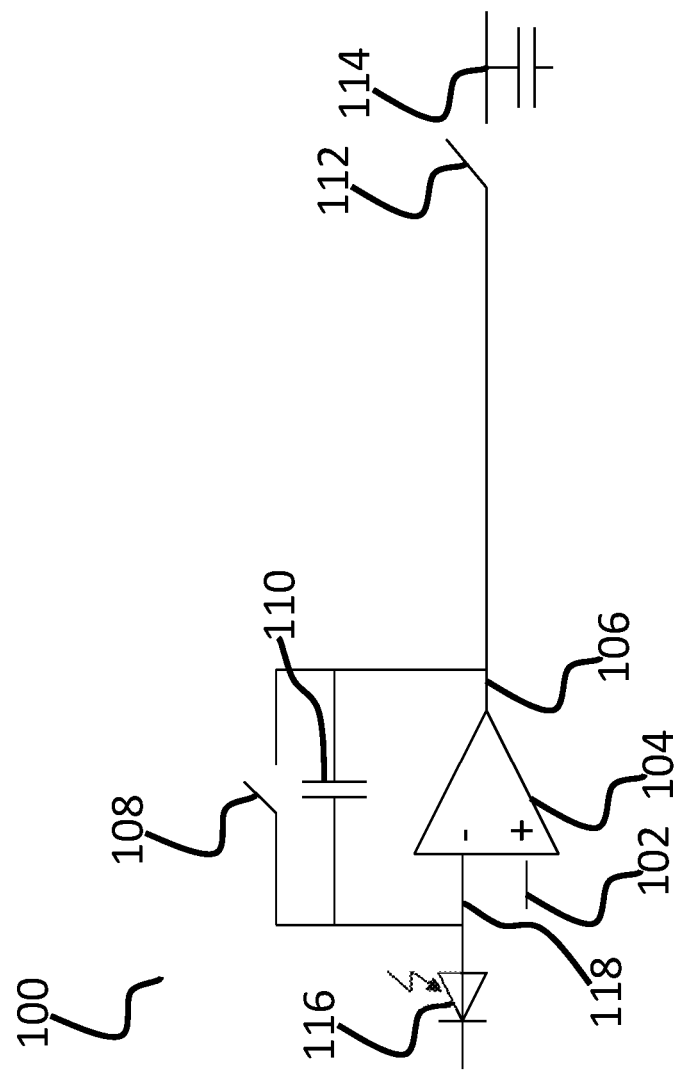
FIG. 1 is a schematic showing a prior art integration circuit.

A simultaneous multiple well (SMW) integration circuit 200 and techniques for using the SMW integration circuit 200 to achieve an enhanced dynamic range, relative to prior art integration circuits 100 and techniques for their use, is herein described. Such SMW integration circuit 200 and techniques for their use allow integration in various circuits, including pixels 400, to occur over multiple well sizes simultaneously during an integration interval. Specifically, by sampling both high gain wells 204 and low gain wells 202 at the end of an integration interval and reading out the integration values during a subsequent integration, enhanced dynamic range is provided. Gain determination may be done on a readout integrated circuit (ROIC) with only the valid gain read out.

Multiple well sizes (gains) on a single SMW integration circuit 200, when used in accordance with the methods provided herein, provide a larger dynamic range output compared to prior art single gain integration circuits 100. For example, relatively low flux pixels 400 are limited in their ability to provide information about relatively high activity (in the case of pixels 400, relatively bright) events because of the use of relatively small, or high gain, wells, which saturate quickly, in their integration circuits 100. The use of larger, or low gain (high flux), wells allows the recording of relatively higher flux events prior to saturation, but results in a relatively lower signal to noise ratio. This limits the ability of the integration circuit 100 to provide accurate information about relatively low-activity events, since any information would have to rise above the higher noise floor to be read out of the integration circuit 100.

By combining both high 204 and low gain wells 202 on a SMW integration circuit 200 in accordance with embodiments of the present disclosure, maximum sensitivity is achieved while providing a large dynamic range.

Now referring to FIG. 1, an exemplary prior-art integration circuit 100 is shown. The prior art integration circuit 100 comprises an operational amplifier 104 having a non-inverting positive input 102, an inverting negative input 118, and an output 106. The integration circuit 100 further comprises a well 110 configured to store a charge during an integration interval, wherein one side of the well 110 is electrically connected to the inverting negative input 118 of the operational amplifier 104 and the other side of the well 110 is electrically connected to the output 106 of the operational amplifier 104. A reset switch 108 is electrically connected across the well 110, which allows resetting of the well 110 upon closure thereof. The output 106 of the operational amplifier 104 is electrically connected to a sample hold 114, configured to store charge for readout by a readout integrated circuit, through a sample hold switch 112, allowing the charge built up on the well 110 during an integration interval to be stored on the sample hold 114 upon sample hold switch 112 closure. The charge may then be read out of the sample hold 114 by traditional circuitry, such as a readout integrated circuit. A detector diode 116 may be electrically connected to the inverting negative input 118 of the operational amplifier 104, prior to the well 110, to generate the flow of electrons in the circuit.

Figure 2:
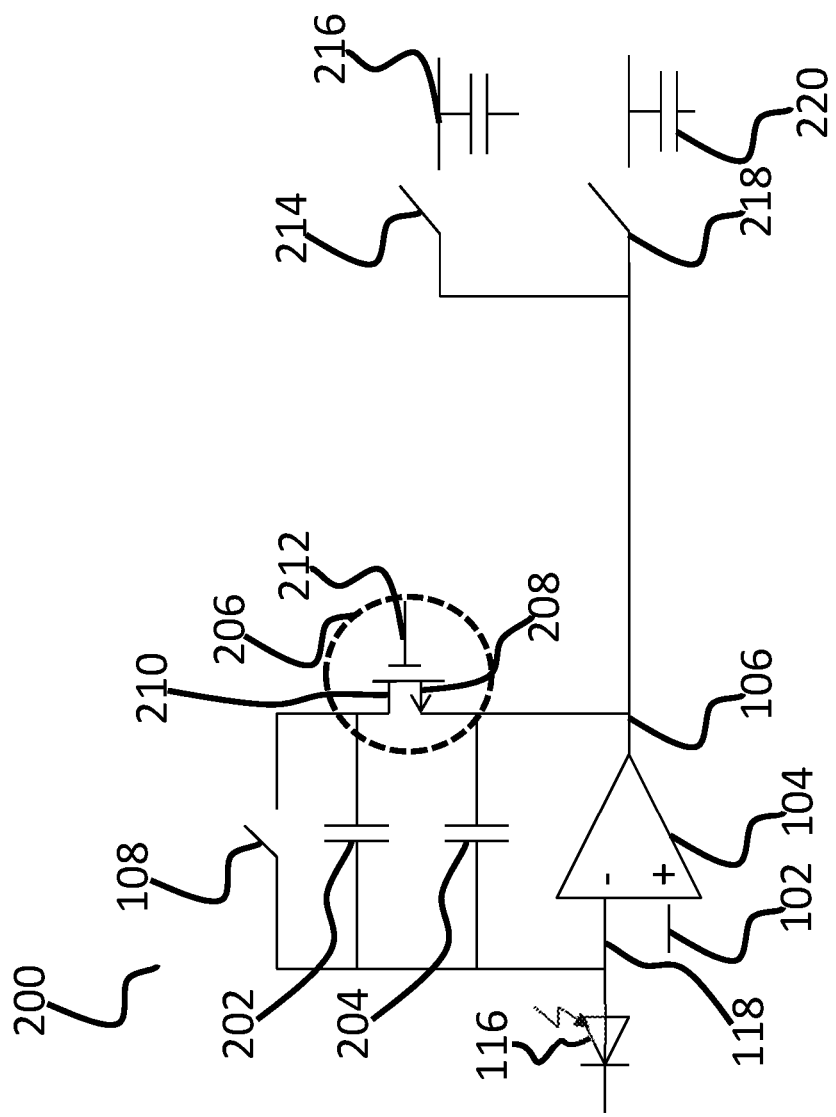
FIG. 2 is a schematic showing a multi-well integration circuit in accordance with embodiments of the present disclosure.

Now referring to FIG. 2, an exemplary SMW integration circuit 200 is shown. SMW integration circuit 200 comprises an operational amplifier 104 having a non-inverting positive input 102, an inverting negative input 118, and an output 106. The integration circuit 100 further comprises at least two wells, at least one relatively high gain well 204 and at least one relatively low gain well 202, each well configured to store a charge during an integration interval. One side of each well is electrically connected to the inverting negative input 118 of the operational amplifier 104 and the other side of each well 110 is electrically connected to the output 106 of the operational amplifier 104. The high gain well 204 and low gain well 202 are connected in parallel. A reset switch 108 is electrically connected across the wells, allowing them to be reset upon closure thereof. Additionally, a switch 206, which, in embodiments may be a Field Effect Transistor (FET) 206 having a source 208, drain 210, and gate 212, is electrically connected between the wells on the output 106 side of the operational amplifier 104.

The output 106 of the operational amplifier 104 is electrically connected to a first sample hold 216, configured to store charge for readout by a readout integrated circuit, through a first sample hold switch 214, allowing the charge built up on a well during an integration interval to be stored on the first sample hold 216 upon first sample hold switch 214 closure. The output 106 of the operational amplifier 104 is also electrically connected to a second sample hold 220, configured to store charge for readout by a readout integrated circuit, through a second sample hold switch 218, allowing the charge built up on a well during an integration interval to be stored on the second sample hold 220 upon second sample hold switch 218 closure.

The charge may then be read out of the first sample hold 216 and second sample hold 220 by traditional circuitry, such as a readout integrated circuit. A detector diode 116 may be electrically connected to the inverting negative input 118 of the operational amplifier 104, prior to the well 110, to generate the flow of electrons in the circuit.

A SMW integration circuit 200 in accordance with embodiments of the present disclosure allows integration to take place on multiple wells 202/204, which may be of various sizes, and then read out of the multiple wells 202/204 following an integration interval.

In embodiments, integration starts with the smallest well size 204 and proceeds to the largest well size 202, if necessary.

In embodiments, if the integrated voltage on a first, in embodiments high gain, well 204 approaches the saturation level of the well 204, a Field Effect Transistor (FET) 206 or similar device may be used to enable integration on another well 202, in some embodiments a relatively low gain well 202. In instances where the first, high gain, well 204 approaches saturation, requiring integration to continue on the low gain well 202, once integration is complete, the relatively higher-gain well 204 (i.e. the smaller well) is sampled first. After the relatively higher-gain well 204 has been sampled, the relatively lower-gain well 202 (i.e. the larger well) may be enabled, allowing the charge to share fully between the multiple wells 202/204. A second sample following charge sharing between the multiple wells 202/204 then provides the low gain output.

In embodiments, each integration circuit comprises at least two capacitors 202/204, which are also referred to herein as wells 202/204, wherein each capacitor 202/204 is of a different capacitance (i.e. well size).

Since SMW integration circuits 200 having high gain wells 204 and low gain wells 202 configured in accordance with embodiments of the present disclosure can use a consistent integration time that does not vary from reading to reading, they are more sensitive than systems which toggle between gains from frame to frame, which results in missing frames used for the unused gain for that pixel 400.

The circuit and techniques described herein allow integration in a pixel 400 with multiple well sizes during the same integration time. Furthermore, the present system allows the use of low noise floor, high gain, wells 204 for lower flux pixels 400 and unsaturated, low gain wells 202 for high flux pixels 400.

If a high gain well 204 approaches saturation, embodiments are configured to detect the change in voltage and, at a threshold voltage, enable a channel to second integration capacitor, in embodiments a relatively lower gain well 202, which then begins to integrate the charge, preventing saturation and increasing dynamic range. If a signal does not result in the additional well 202 becoming enabled, the signal can be considered a valid high-gain output that can be read out of the system. In the case where the signal did result in the additional well 202 becoming enabled, the signal can be considered a saturated level, which, in embodiments, is controlled by a gain control FET 206, indicating that the low gain well 202 output should be taken into account in addition to the high gain well 204 output.

In embodiments, high gain well 204 sampling is performed at end of integration on an amplifier output 106.

In embodiments, both high gain wells 204 and low gain wells 202 may be sampled at the conclusion of the selected integration interval and read out during the subsequent integration interval.

In embodiments, the low gain well 202 sample is performed following high gain well 204 sampling.

In further embodiments, a gain control FET 206 is turned on following integration of the high gain well 204, allowing charge to be fully shared between the high gain well 204 and low gain well 202, prior to sampling of the low gain well 202. This technique allows for measurement whether or not the high gain well 204 was saturated.

In embodiments of the present disclosure, the steps relating to integration and readout thereof from the SMW integration circuit 200 are as follows:

Step 1—Reset: Enable Gain control FET 206 and reset switch 108 to reset all integration capacitors 202/204;

Step 2—Integration: Set gain control FET 206 to turn on when integrated output approaches saturation (a low value near ground in the example circuit shown in FIG. 2), then disable reset switch 108;

High Gain: If output never gets near saturation, all integrated charge is on high gain capacitor 204 at end of integration and high gain output is in range;

Low Gain: If output does get near saturation, charge begins to flow through the gain control FET 206, beginning integration on the low gain integration capacitor 202. High gain output is saturated;

Step 3—High Gain Sample: Sample output on sample hold 1 216 by closing sample hold 1 switch 214, this is the high gain well 204 output. Open sample hold 1 switch 214; and Step 4—Low Gain Sample: Enable gain control FET 206 to allow integration charge to be shared across both integration capacitors 202/204. Sample output on sample hold 2 220 by closing sample hold 2 switch 218. Open sample hold 2 switch 218. Note: This measure will be valid even if high gain well 204 output was not saturated.

Since both gains of embodiments of the present disclosure use the full integration time, higher sensitivity than using integration time to change gain is achieved. The present systems and methods also provide higher sensitivity than reading out alternate frames with different gains, since the proper gain is available during every frame. The present disclosure also provides higher dynamic range than a single well size 110, since, in embodiments, the high gain well 204 has a lower noise floor and the low gain well 202 has a higher saturation flux.

In embodiments, the gain control FET 206 is an N-Type FET.

Embodiments of the present disclosure could be used in many different infrared focal plane array applications where higher dynamic range and multiple gain state outputs are allowed.

Figure 3:
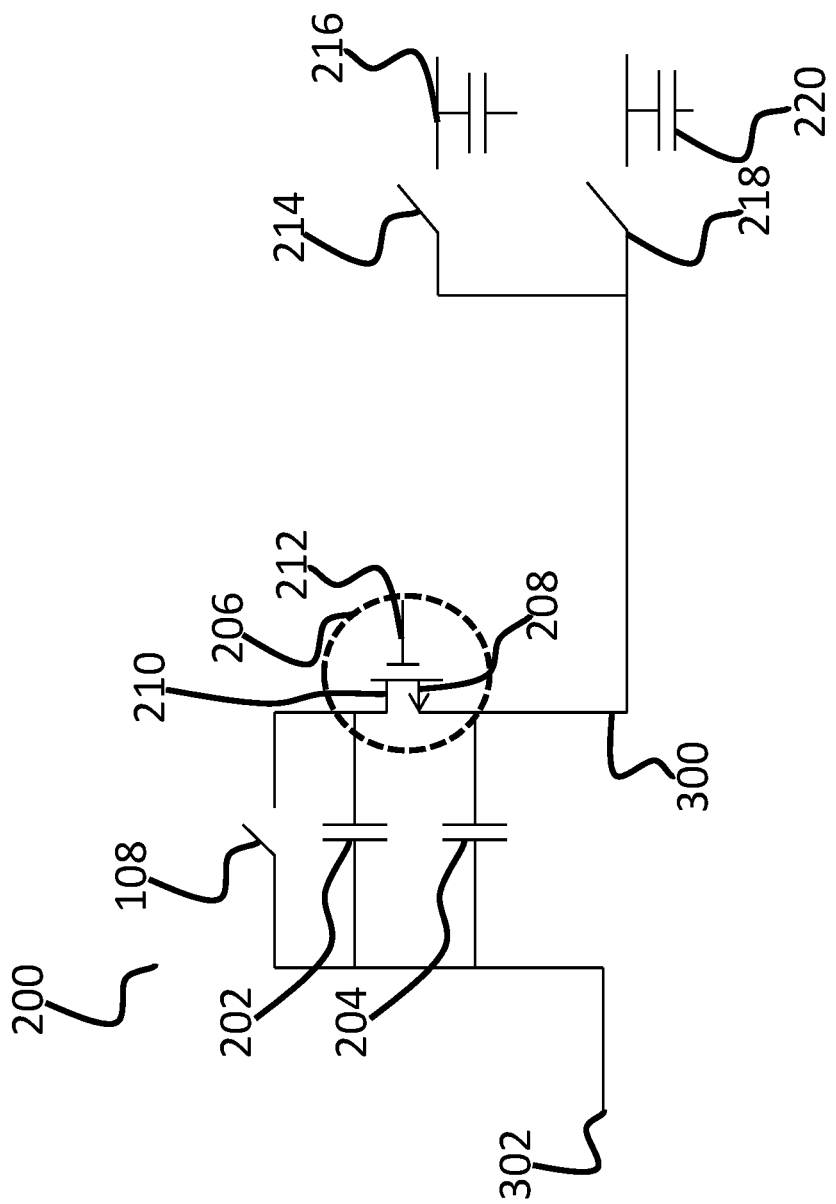
FIG. 3 is a schematic showing a multi-well integration circuit in accordance with embodiments of the present disclosure.

Now referring to FIG. 3, an embodiment of the SMW integration circuit 200 omitting the operational amplifier 104 and replacing it with a current input 300 and reference voltage 302, in accordance with embodiments of the present disclosure, is shown. Taking into account the polarity and orientation of the FET 206 shown in this figure, the input 300 would be a negative current integrating to a lower voltage and the reference voltage 302 would be a more positive voltage.

Figure 4:
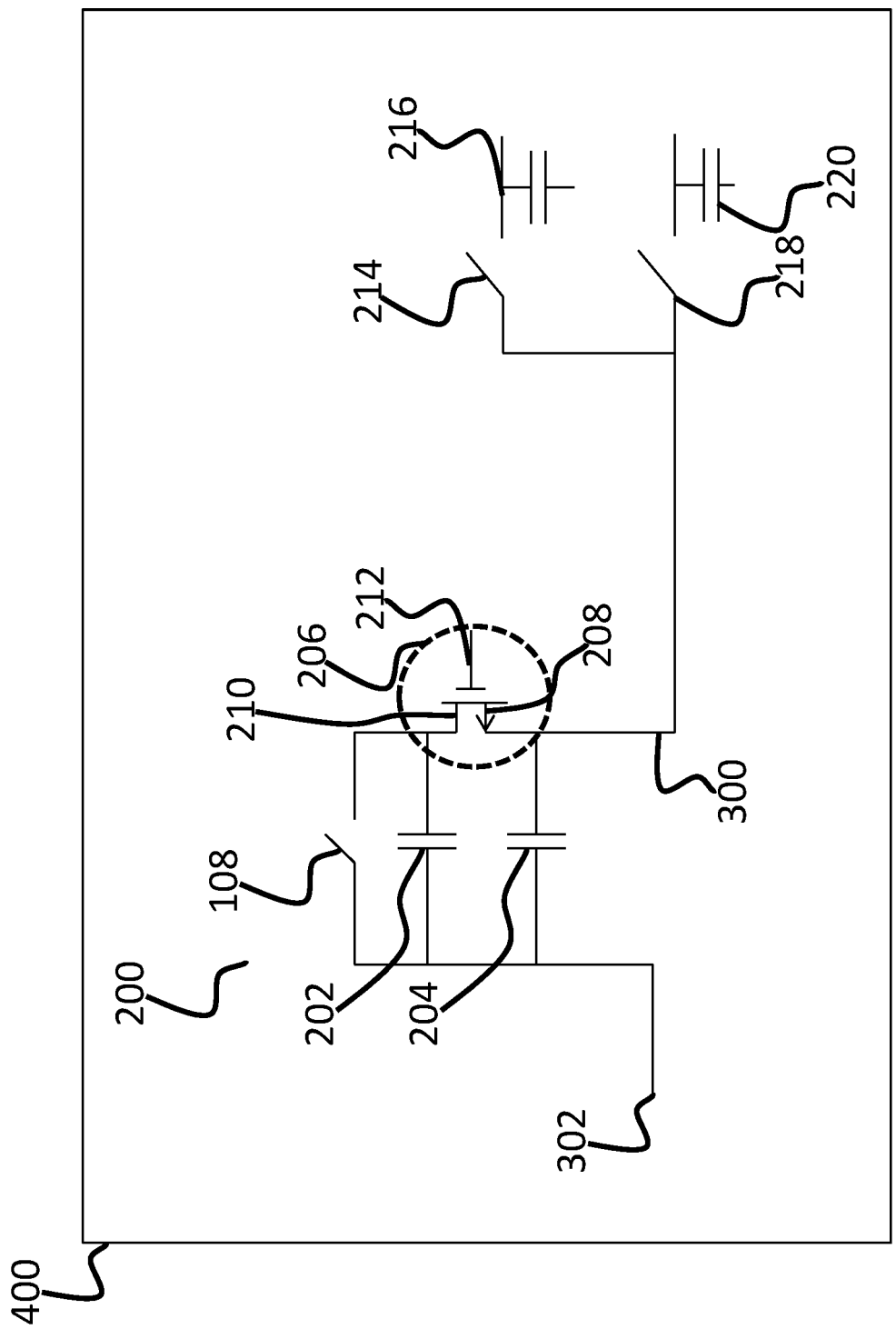
FIG. 4 is a schematic showing a multi-well integration circuit embedded in a pixel, in accordance with embodiments of the present disclosure.

Now referring to FIG. 4, the embodiment of the SMW integration circuit 200 shown in FIG. 3 is shown as part of a pixel 400, in accordance with embodiments of the present disclosure. Although only the embodiment of FIG. 3 is shown incorporated into a pixel 400, the embodiment shown in FIG. 2 and others described herein could also be incorporated into a pixel 400.

Figure 5:
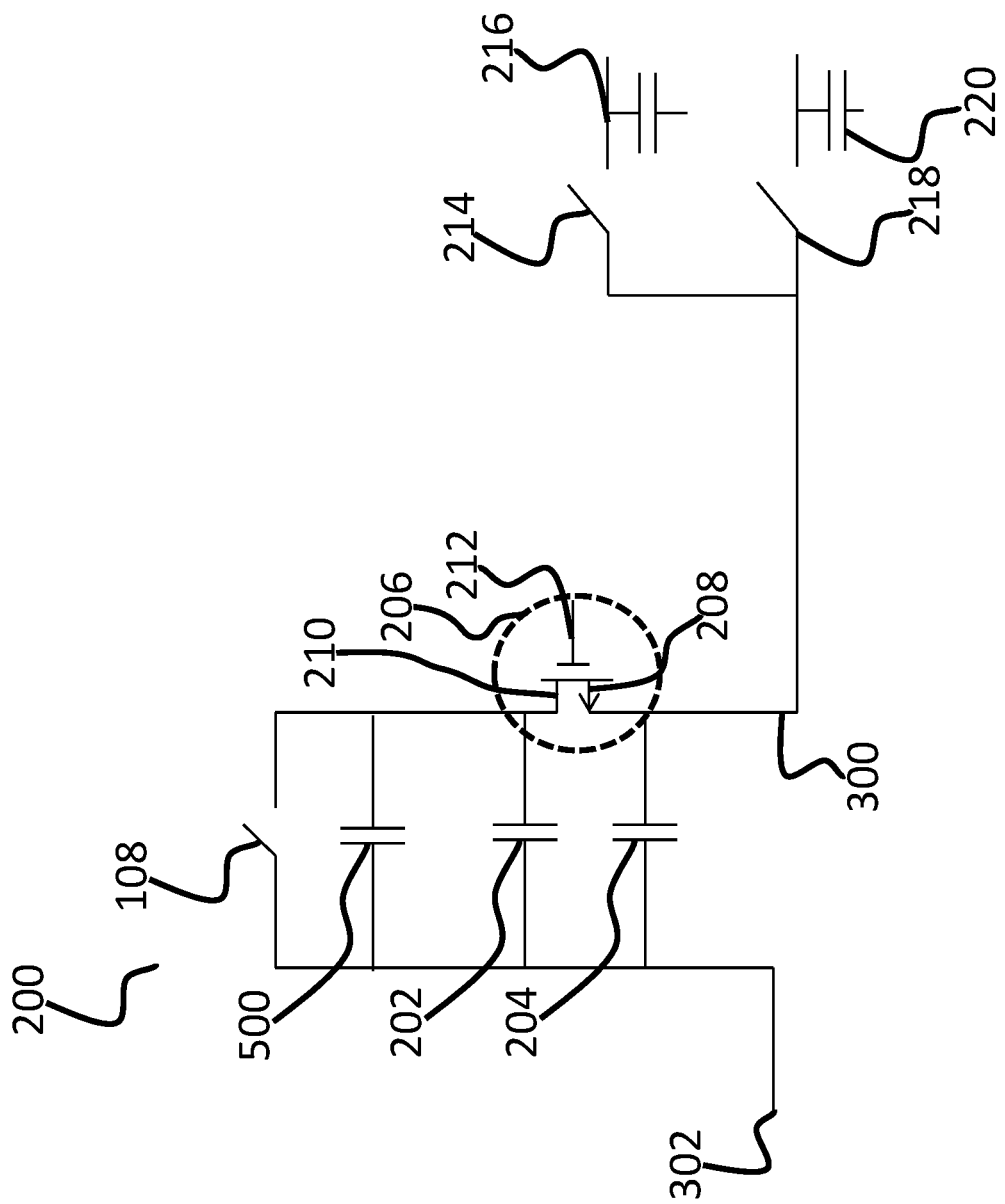
FIG. 5 is a schematic showing a multi-well integration circuit in accordance with embodiments of the present disclosure.

Now referring to FIG. 5, and embodiment of the SMW integration circuit 200 having a third well 500 is shown. In embodiments, this third well 500 may be an even lower gain well 500 than the low gain well 202. Furthermore, it should be noted that it is contemplated as within the scope of the present disclosure to add additional wells to the basic structure of the SMW integration circuit 200 disclosed herein and that, in doing so, even greater dynamic range may be achieved.

The foregoing description of the embodiments of the disclosure has been presented for the purposes of illustration and description. It is not intended to be exhaustive or to limit the disclosure to the precise form disclosed. Many modifications and variations are possible in light of this disclosure. It is intended that the scope of the disclosure be limited not by this detailed description, but rather by the claims appended hereto.

What is claimed is:

1. An integration circuit, the integration circuit comprising:

an input configured to carry an input current;

a first well comprising an input, an output, and a first integration capacitor configured to collect the input current, wherein a first well voltage changes proportionally to the input current over an integration time;

a second well comprising an input, an output, and a second integration capacitor configured to collect the input current, wherein a second well voltage changes proportionally to the input current over an integration time and wherein said second well input begins to collect a charge from the input current when the first well voltage approaches a predetermined level;
a reset switch electrically connected between the input and output of said second well;
a gain control transistor electrically connected between the output of said second well and the output of said first well and configured to allow charge to be integrated on said second well when the first well is full;
a first sampling switch electrically connected to the first well;
a first voltage-measuring device electrically connected to said first sampling switch, such that charge flows through said first sampling switch into said first voltage-measuring device upon closure of said first sampling switch;
a second sampling switch electrically connected to said first well; and
a second voltage-measuring device electrically connected to said second sampling switch, such that charge flows through said second sampling switch into said second voltage-measuring device upon closure of said second sampling switch.

2. The integration circuit of claim 1 further comprising an amplifier with capacitive feedback electrically connected between the inputs and outputs of said first and second wells.

3. The integration circuit of claim 1 further comprising a bias control transistor having a source, a gate, and a drain, wherein said source is connected to the input, said gate is connected to a bias control voltage and said drain is connected to the output of said first and second integration capacitors.

4. The integration circuit of claim 3 further comprising an inverting amplifier connected between the source and gate of said bias control transistor.

5. The integration circuit of claim 1 further comprising one or more additional integration wells, each additional well having an additional corresponding gain control FET, sampling switch and voltage measuring device, thereby allowing more than two gain states.

6. A pixel comprising the integration circuit of claim 1.

7. An integration circuit, the integration circuit comprising:
an operational amplifier comprising a non-inverting positive input, a non-inverting negative input, and an output;
a first well having an input and an output, wherein said first well input is electrically connected to the inverting negative input of said operational amplifier and said first well output is electrically connected to the output of said operational amplifier;
a second well having an input and an output, wherein said second well input is electrically connected the non-inverting negative input of said operational amplifier and said second well output is electrically connected to the output of said operational amplifier, wherein said first well and said second well are connected in parallel;
a reset switch electrically connected between the input and output of said second well;
a gain control switch electrically connected between the output of said second well and the output of said first well;
a first sampling switch electrically connected to the output of said operational amplifier;
a first charge-measuring device electrically connected to said first sampling switch, such that charge flows through the first sampling switch into the first charge-measuring device upon closure of the first sampling switch;
a second sampling switch electrically connected to the output of said operational amplifier; and
a second charge-measuring device electrically connected to said second sampling switch, such that charge flows through the second sampling switch into the second charge-measuring device upon closure of the second sampling switch.

8. The integration circuit of claim 7 wherein said second well is of a relatively lower gain compared to said first well.

9. The integration circuit of claim 7 wherein said gain control switch is a field effect transistor having a source, a drain, and a gate, wherein said source and drain are connected between the outputs of said first and second wells and said gate is electrically connected to a source of voltage proportional to a charge on said first well, wherein said gate is configured to allow charge to flow between said drain and source upon a threshold voltage indicative of said first well nearing saturation, thereby allowing charge to flow to said second well.

10. The integration circuit of claim 9 wherein said field effect transistor is an n-type field effect transistor.

11. The integration circuit of claim 10 wherein said drain is electrically connected to said output of said second well, said source is electrically connected to said output of said first well.

12. The integration circuit of claim 7 wherein each well comprises at least one capacitor.

13. The integration circuit of claim 7 further comprising a detector diode electrically connected to the inverting negative input of said operational amplifier.

14. The integration circuit of claim 7 further comprising one or more additional integration wells, each additional well having an additional corresponding gain control FET, sampling switch and voltage measuring device, thereby allowing more than two gain states.

15. A pixel comprising the integration circuit of claim 7.

16. A method of operating an integration circuit, the method comprising:
on an integration circuit comprising:
an operational amplifier comprising a non-inverting positive input, a non-inverting negative input, and an output;
a first well having an input and an output, wherein said first well input is electrically connected to the inverting negative input of said operational amplifier and said first well output is electrically connected to the output of said operational amplifier;
a second well having an input and an output, wherein said second well input is electrically connected the non-inverting negative input of said operational amplifier and said second well output is electrically connected to the output of said operational amplifier, wherein said first well and said second well are connected in parallel;
a reset switch electrically connected between the input and output of said second well;
a gain control field effect transistor having a source, a drain, and a gate, wherein said source and drain are connected between the outputs of said first and second wells and said gate is electrically connected to a source of voltage proportional to a charge on said first well, wherein said gate is configured to allow charge to flow between said drain and source upon a threshold voltage indicative of said first well nearing saturation, thereby allowing charge to flow to said second well;

a first sampling switch electrically connected to the output of said operational amplifier;

a first charge-measuring device electrically connected to said first sampling switch, such that charge flows through the first sampling switch into the first charge-measuring device upon closure of the first sampling switch;

a second sampling switch electrically connected to the output of said operational amplifier; and a second charge-measuring device electrically connected to said second sampling switch, such that charge flows through the second sampling switch into the second charge-measuring device upon closure of the second sampling switch;

wherein said integration circuit is electrically connected to a source of current to be measured over an integration interval;

integrating a current over an integration interval by:

applying a voltage in excess of the threshold voltage to the gain control field effect transistor, thereby enabling current to flow between the source and drain thereof;

closing the reset switch, thereby resetting said first and second wells;

removing said voltage from said gate of said gain control field effect transistor;

opening said reset switch, thereby allowing charge to build on said first well;

wherein, if said first well approaches saturation charge flows through said gain control field effect transistor, allowing integration to continue on said second well;

sampling said first well by disconnecting said threshold voltage from said gate of said gain control field effect transistor, if a threshold voltage was applied during the integration interval, and closing said first sampling switch, thereby allowing charge from said first well to flow into said first charge measuring device; and if a threshold voltage was applied to the gate of said gain control field effect transistor during the integration interval, opening said second sampling switch and applying a threshold voltage to said gate of said gain control field effect transistor, thereby allowing charge to equalize between said first and second wells and to flow into said second charge-measuring device.

17. The method of operating an integration circuit of claim 16 wherein said first well is of a relatively higher-gain.

18. The method of operating an integration circuit of claim 16 wherein a voltage above the threshold voltage is applied to the gate of said gain control field effect transistor following an integration interval regardless of whether or not the first well was saturated, allowing charge to be fully shared across said first and second wells, prior to sampling, allowing for charge measurement on either the first or second charge measuring device whether or not the first well was saturated during the integration interval.

19. The method of operating an integration circuit of claim 16 wherein the charge transferred to said first and second charge-measuring devices is read out during a subsequent integration.

20. The method of operating an integration circuit of claim 19 wherein said charge is read out of said first and second charge-measuring devices by a readout integrated circuit.

* * * * *